United States Patent
Ho et al.

(10) Patent No.: US 12,340,735 B1
(45) Date of Patent: Jun. 24, 2025

(54) PIXEL ARRAY SUBSTRATE

(71) Applicant: AUO Corporation, Hsinchu (TW)

(72) Inventors: Kuo-Wei Ho, Hsinchu (TW);
Sheng-Yen Cheng, Hsinchu (TW);
Yueh-Hung Chung, Hsinchu (TW);
Ya-Ling Hsu, Hsinchu (TW)

(73) Assignee: AUO Corporation, Hsinchu (TW)

( * ) Notice: Subject to any disclaimer, the term of this patent is extended or adjusted under 35 U.S.C. 154(b) by 0 days.

(21) Appl. No.: 18/603,239

(22) Filed: Mar. 13, 2024

(30) Foreign Application Priority Data

Dec. 20, 2023 (TW) ................ 112149758

(51) Int. Cl.
*G09G 3/32* (2016.01)
*H01L 25/075* (2006.01)
*H01L 25/16* (2023.01)
*H10D 86/40* (2025.01)
*H10D 86/60* (2025.01)
*H10H 20/857* (2025.01)

(52) U.S. Cl.
CPC .......... *G09G 3/32* (2013.01); *H01L 25/0753* (2013.01); *H01L 25/167* (2013.01); *H10D 86/441* (2025.01); *H10D 86/60* (2025.01); *H10H 20/857* (2025.01); *G09G 2310/0267* (2013.01); *G09G 2310/0275* (2013.01)

(58) Field of Classification Search
CPC ............. G09G 3/32; G09G 2310/0267; G09G 2310/0275; H01L 25/0753; H01L 25/167; H10D 86/441; H10D 86/60; H10H 20/857

See application file for complete search history.

(56) References Cited

U.S. PATENT DOCUMENTS

| | | |
|---|---|---|
| 9,595,546 B2 | 3/2017 | Kim et al. |
| 11,347,350 B2 | 5/2022 | Lee et al. |
| 11,636,794 B2 | 4/2023 | Chang et al. |
| 2008/0042962 A1* | 2/2008 | Hung .............. G09G 3/3674 345/98 |
| 2015/0293546 A1* | 10/2015 | Tanaka .............. G02F 1/136286 327/541 |

(Continued)

FOREIGN PATENT DOCUMENTS

TW 202228123 7/2022

*Primary Examiner* — Temesghen Ghebretinsae
*Assistant Examiner* — Sosina Abebe
(74) *Attorney, Agent, or Firm* — JCIPRNET

(57) ABSTRACT

A pixel array substrate includes a substrate, a gate driver circuit, a first conductive pattern, a first dielectric layer, a second conductive pattern, a second dielectric layer, and a third conductive pattern. The first conductive pattern includes a first branch clock signal line which is electrically connected to the gate driver circuit. The first conductive pattern is located between the substrate and the first dielectric layer. The second conductive pattern is located between the first dielectric layer and the second dielectric layer and includes a shielding structure. The third conductive pattern is located on the second dielectric layer and includes a first clock signal line and a data line. The first branch clock signal line electrically connects the first clock signal line to the gate driver circuit and intersects the data line. The shielding structure is located between the data line and the first branch clock signal line.

10 Claims, 11 Drawing Sheets

(56) References Cited

U.S. PATENT DOCUMENTS

| | | | |
|---|---|---|---|
| 2016/0019856 A1* | 1/2016 | Tanaka | G09G 3/3666 |
| | | | 345/206 |
| 2017/0025070 A1* | 1/2017 | Kang | G09G 3/3233 |
| 2017/0123253 A1* | 5/2017 | Sugita | G02F 1/13338 |
| 2023/0117897 A1* | 4/2023 | Kim | G09G 3/32 |
| | | | 345/691 |
| 2025/0078735 A1* | 3/2025 | Jang | G09G 3/3266 |
| 2025/0081610 A1* | 3/2025 | Xiao | H10D 86/60 |

* cited by examiner

PIXEL ARRAY SUBSTRATE

CROSS-REFERENCE TO RELATED APPLICATION

This application claims the priority benefit of Taiwan application serial no. 112149758, filed on Dec. 20, 2023. The entirety of the above-mentioned patent application is hereby incorporated by reference herein and made a part of this specification.

BACKGROUND

Technical Field

The disclosure relates to a pixel array substrate.

Description of Related Art

Due to the impressive visual effects of large-sized display panels, these panels have found widespread applications in the market. For instance, these panels may be utilized in cinemas, digital billboards, modern education, online meeting platforms, playgrounds, and so on, providing an exceptional user experience through the remarkable display capabilities of the large-sized display panels. However, it is noteworthy that there are some technical challenges within the internal components of these panels. One such challenge is to avoid interference from other signals during long-distance transmission, which may potentially have a negative impact on display quality.

SUMMARY

The disclosure provides a pixel array substrate capable of reducing mutual interference between a clock signal and a data line signal.

At least one embodiment of the disclosure provides a pixel array substrate that includes a substrate, a gate driver circuit, a first conductive pattern, a first dielectric layer, a second conductive pattern, a second dielectric layer, and a third conductive pattern. The gate driver circuit is disposed above the substrate. The first conductive pattern is located above the substrate and includes a first branch clock signal line. The first branch clock signal line is electrically connected to the gate driver circuit. The first conductive pattern is located between the substrate and the first dielectric layer. The second conductive pattern is located on the first dielectric layer and includes a shielding structure that is overlapped with the first branch clock signal line. The second dielectric layer is located on the first dielectric layer. The second conductive pattern is located between the first dielectric layer and the second dielectric layer. The third conductive pattern is located on the second dielectric layer and includes a first clock signal line and a data line. The first branch clock signal line electrically connects the first clock signal line to the gate driver circuit and intersects the data line. The shielding structure is located between the data line and the first branch clock signal line.

Several exemplary embodiments accompanied with figures are described in detail below to further describe the disclosure in details.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1:
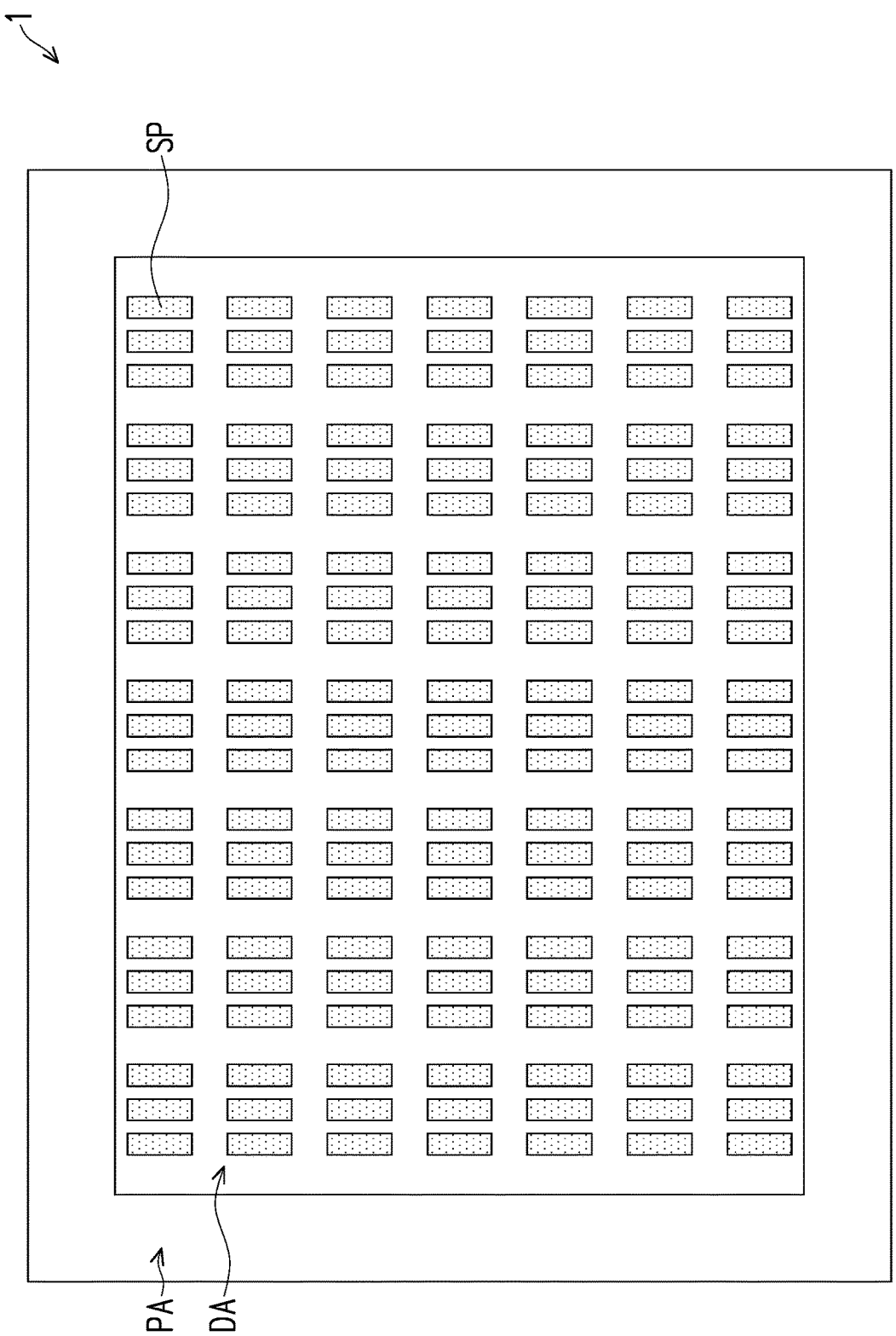
FIG. 1 is a schematic top view of a pixel array substrate according to an embodiment of the disclosure.

FIG. 1 is a schematic top view of a pixel array substrate 1 according to an embodiment of the disclosure. For clarity, FIG. 1 shows a plurality of sub-pixels SP of the pixel array substrate 1, while other components are omitted. With reference to FIG. 1, the pixel array substrate 1 includes a display area DA and a peripheral area PA that is located on at least one side of the display area DA. The sub-pixels SP are arrayed in the display area DA. In some embodiments, the sub-pixels SP include active devices (e.g., thin film transistors) and passive devices (e.g., storage capacitors). In some embodiments, each of the sub-pixels SP is electrically connected to a corresponding light emitting device and is configured to control the light emission of the light emitting device. The light emitting device may include a micro light emitting diode, an organic light emitting diode, or any other light emitting device, and the display area DA may include different color light emitting devices, such as a red light emitting device, a green light emitting device, and a blue light emitting device. The sub-pixels SP correspond to a plurality of different color light emitting devices and constitute a plurality of pixels. In other embodiments, the sub-pixels SP are configured to control liquid crystal molecules, electrophoretic media, or other types of display media.

Figure 2A:
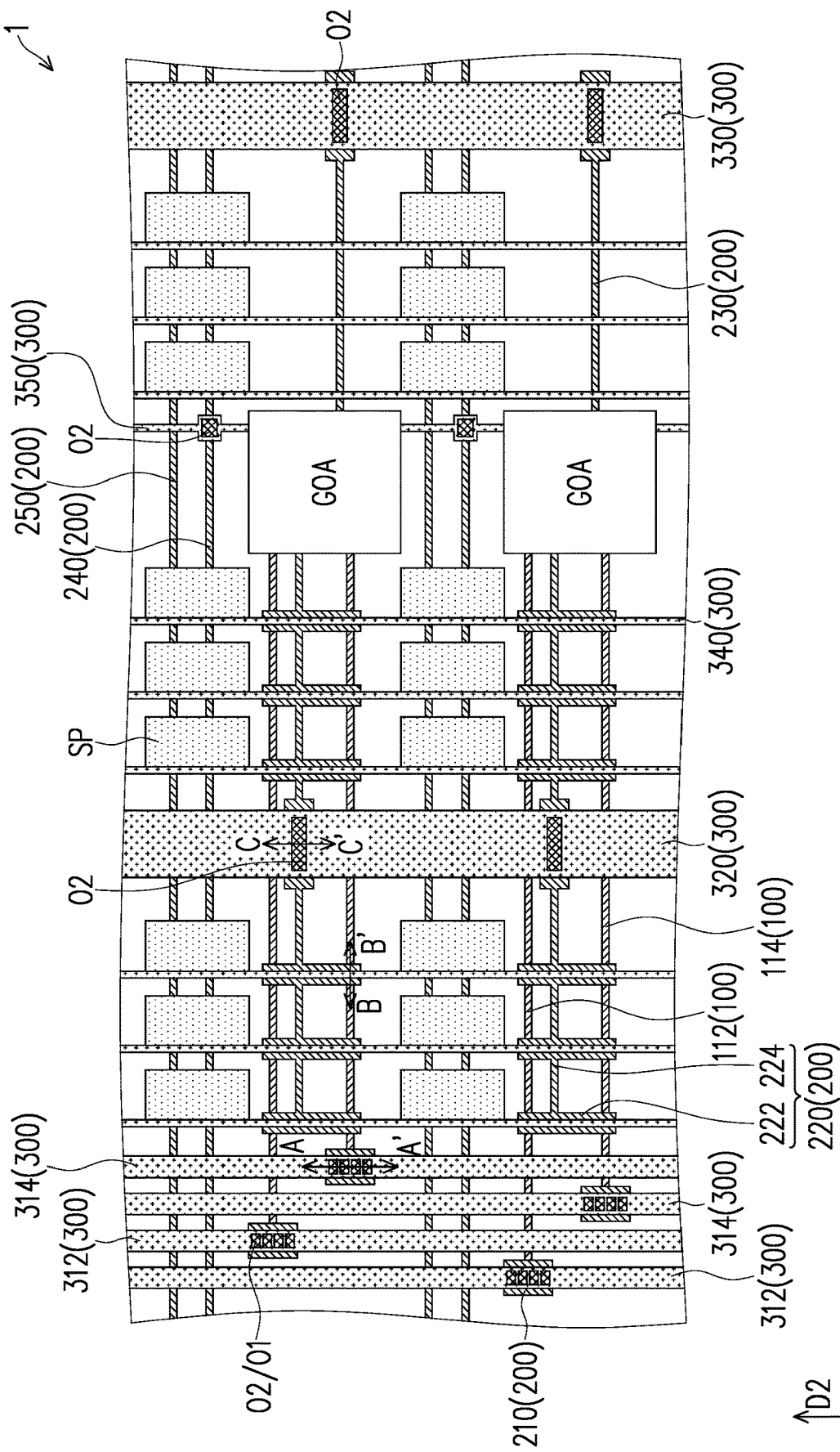
FIG. 2A is a schematic top view of a pixel array substrate according to an embodiment of the disclosure.
Figure 2B:
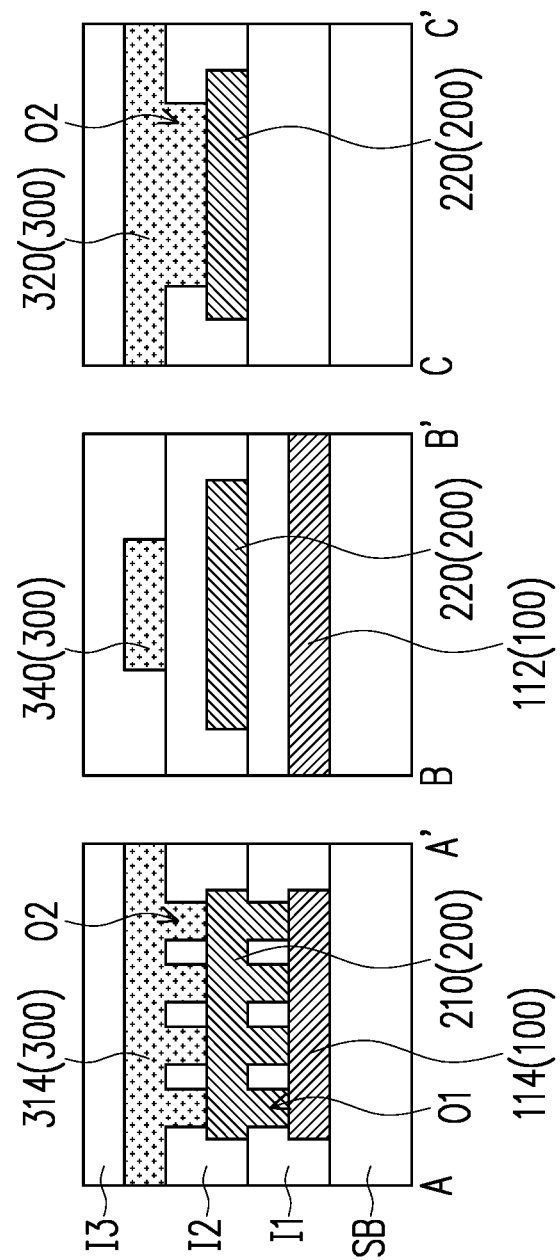
FIG. 2B is a schematic cross-sectional view taken along the sectional line A-A', the sectional line B-B', and the sectional line C-C' depicted in FIG. 2A.

FIG. 2A is a schematic top view of the pixel array substrate 1 according to an embodiment of the disclosure. For instance, FIG. 2A is a schematic enlarged top view of a portion of the pixel array substrate 1. FIG. 2B is a schematic cross-sectional view taken along the sectional line A-A', the sectional line B-B', and the sectional line C-C' depicted in FIG. 2A. With reference to FIG. 2A and FIG. 2B, the pixel array substrate 1 includes a substrate SB, gate driver circuits GOA, first conductive patterns 100, first dielectric layers I1, second conductive patterns 200, second dielectric layers I2, third conductive patterns 300, and third dielectric layers I3.

In some embodiments, the substrate SB may be a rigid substrate, and a material of the substrate SB may include glass, quartz, an organic polymer, or an opaque/reflective material (e.g., a conductive material, metal, a wafer, a ceramic material, or any other appropriate material), or any other appropriate material, which should however not be construed as a limitation in the disclosure. In other embodiments, the substrate SB may also be a flexible substrate or a stretchable substrate. For instance, materials for the flexible substrate and the stretchable substrate include polyimide (PI), polydimethylsiloxane (PDMS), polyethylene terephthalate (PET), polyethylene naphthalate (PEN), polyester (PES), polymethylmethacrylate (PMMA), polycarbonate (PC), polyurethane (PU), or other appropriate materials.

The gate driver circuits GOA and the sub-pixels SP are disposed above the substrate SB. In some embodiments, the gate driver circuits GOA and the sub-pixels SP respectively include the active devices (e.g., thin film transistors) and the passive devices, and the active devices and the passive devices are distributed in the first dielectric layers I1, the second dielectric layers I2, and the third dielectric layers I3. For instance, the active devices include the thin film transistors, and electrodes and semiconductor layers sandwiched between different dielectric layers constitute the above-mentioned thin film transistors. The number of the thin film transistors in the gate driver circuits GOA and the sub-pixels SP may be adjusted according to actual needs. The gate driver circuits GOA are configured to provide scan line signals to switch devices in the sub-pixels SP. In some embodiments, the gate driver circuits GOA are further configured to provide the sub-pixels SP with compensation control signals and light emitting control signals.

Note that locations of the gate driver circuits GOA in FIG. 2A are simply schematic; in fact, the gate driver circuits GOA may include a plurality of active devices, and the active devices are distributed around different sub-pixels SP and are electrically connected through various conductive lines. Therefore, a distribution range of the gate driver circuits GOA may cross over more sub-pixels SP than what is shown in FIG. 2A.

The first conductive patterns 100 are located above the substrate SB. In some embodiments, a material of the first conductive patterns 100 includes a metal material (chromium, gold, silver, copper, tin, lead, hafnium, tungsten, molybdenum, neodymium, titanium, tantalum, aluminum, zinc, alloys of the above-mentioned metals, or stacked layers of the above-mentioned metals), which should however not be construed as a limitation in the disclosure. According to other embodiments, the first conductive patterns 100 may also include other conductive materials, such as nitrides of metals, oxides of metals, oxynitrides of metals, other appropriate materials, or stacked layers of metals and other conductive materials. The first conductive patterns 100 have single-layer structures or multi-layer structures.

The first conductive patterns 100 include a plurality of first branch clock signal lines 112 and a plurality of second branch clock signal lines 114. The first branch clock signal lines 112 and the second branch clock signal lines 114 are electrically connected to the gate driver circuits GOA. Each gate driver circuit GOA is electrically connected to one corresponding first branch clock signal line 112 and one corresponding second branch clock signal line 114. In some embodiments, the first branch clock signal lines 112 and the second branch clock signal lines 114 extend along a first direction D1.

The first dielectric layers I1 are located on the first conductive patterns 100. The first conductive patterns 100 are located between the substrate SB and the first dielectric layers I1. In some embodiments, a material of the first dielectric layers I1 includes silicon oxide, silicon nitride, silicon oxynitride, aluminum oxide, hafnium oxide, an organic insulation material, or any other appropriate material.

The second conductive patterns 200 are located on the first dielectric layers I1. In some embodiments, the first dielectric layers I1 have a plurality of first openings O1, where a portion of the second conductive patterns 200 is electrically connected to the first conductive patterns 100 through the first openings O1. In some embodiments, a material of the second conductive patterns 200 includes a metal material (chromium, gold, silver, copper, tin, lead, hafnium, tungsten, molybdenum, niobium, titanium, tantalum, aluminum, zinc, alloys of the above-mentioned metals, or stacked layers of the above-mentioned metals), which should however not be construed as a limitation in the disclosure. According to other embodiments, the second conductive patterns 200 may also include other conductive materials, such as nitrides of metals, oxides of metals, oxynitrides of metals, other appropriate materials, or stacked layers of metals and other conductive materials. The second conductive patterns 200 may have single-layer structures or multi-layer structures.

The second conductive patterns 200 include a plurality of transfer structures 210, a plurality of shielding structures 220, a plurality of transmission lines 230, a plurality of scan lines 240, and a plurality of common signal lines 250. The shielding structures 220 are respectively overlapped with the first branch clock signal lines 112 and the second branch clock signal lines 114. In this embodiment, the shielding structures 220 extend from the top of the first branch clock signal lines 112 to the top of the second branch clock signal lines 114.

Each of the first branch clock signal lines 112 and each of the second branch clock signal lines 114 are electrically connected to one corresponding transfer structure 210. For instance, one transfer structure 210 is electrically connected to the corresponding first branch clock signal line 112 through one corresponding first opening O1, while another transfer structure 210 is electrically connected to the corresponding second branch clock signal line 114 through another corresponding first opening O1.

The shielding structure 220 includes a plurality of block structures 222 and at least one connection line 224. The at least one connection line 224 extends along the first direction D1 and connects the block structures 222. In this embodiment, an orthogonal projection of the at least one connection line 224 on the substrate SB is located between an orthogonal projection of the first branch clock signal lines 112 and an orthogonal projection of the second branch clock signal lines 114 on the substrate SB, and the block structures 222 extend from the top of the first branch clock signal lines 112 to the top of the second branch clock signal lines 114. A width of the block structures 222 in a second direction D2 is greater than a width of the at least one connection line 224 in the second direction D2. The second direction D2 is not parallel to the first direction D1. For instance, the second direction D2 is perpendicular to the first direction D1. In this embodiment, the shielding structures 220 and the transmission lines 230 are electrically connected to the gate driver circuits GOA.

The scan lines 240 and the common signal lines 250 extend along the first direction D1, and the scan lines 240 and the common signal lines 250 are electrically connected to the sub-pixels SP. For instance, the scan lines 240 are electrically connected to gates of the switch devices in the sub-pixels SP and provide scan line signals to the gates of the switch devices. The common signal lines 250, for instance, are configured to provide direct current voltage signals (which may refer to VDD signals, VSS signals, or reference voltage signals in some devices) to the sub-pixels SP. In FIG. 2A, each sub-pixel SP is electrically connected to one common signal line 250, which should however not be construed as a limitation in the disclosure. In other embodiments, each sub-pixel SP is electrically connected to a plurality of the common signal lines 250, and different common signal lines 250 are configured to provide different direct current voltage signals. In this embodiment, the scan lines 240 and the common signal lines 250 belong to the second conductive patterns 200, which should however not be construed as a limitation in the disclosure. In other embodiments, the scan lines 240 and/or the common signal lines 250 belong to the first conductive patterns 100.

The second dielectric layers I2 are located above the first dielectric layers I1. The second conductive patterns 200 are located between the first dielectric layers I1 and the second dielectric layers I2. In some embodiments, a material of the second dielectric layers I2 includes silicon oxide, silicon nitride, silicon oxynitride, aluminum oxide, hafnium oxide, an organic insulation material, or any other appropriate material.

The third conductive patterns 300 are located on the second dielectric layers I2. In some embodiments, the second dielectric layers I2 have a plurality of second openings O2, through which a portion of the third conductive patterns 300 are electrically connected to the second conductive patterns 200. In some embodiments, a material of the third conductive patterns 300 includes metal materials (chromium, gold, silver, copper, tin, lead, hafnium, tungsten, molybdenum, neodymium, titanium, tantalum, aluminum, zinc, alloys of the above-mentioned metals, or stacked layers of the above-mentioned metals), which should however not be construed as a limitation in the disclosure. According to other embodiments. According to other embodiments, the third conductive patterns 300 may also include other conductive materials, such as nitrides of metals, oxides of metals, oxynitrides of metals, other appropriate materials, or stacked layers of metals and other conductive materials. The third conductive patterns 300 may have single-layer structures or multi-layer structures.

The third dielectric layers I3 are located above the second dielectric layers I2. The third conductive patterns 300 are located between the second dielectric layers I2 and the third dielectric layers I3. In some embodiments, a material of the third dielectric layers I3 includes silicon oxide, silicon nitride, silicon oxynitride, aluminum oxide, hafnium oxide, an organic insulation material, or any other appropriate material.

The third conductive pattern 300 includes at least one first clock signal line 312, at least one second clock signal line 314, a first direct current voltage signal line 320, a second direct current voltage signal line 330, a plurality of data lines 340, and an output signal line 350. In some embodiments, the first clock signal line 312, the second clock signal line 314, the first direct current voltage signal line 320, the second direct current voltage signal line 330, the data lines 340, and the output signal line 350 extend along the second direction D2.

The first branch clock signal line 112 electrically connects the first clock signal line 312 to the gate driver circuit GOA. For instance, the first clock signal line 312 is electrically connected to the corresponding transfer structure 210 through the corresponding second opening O2 and then electrically connected to the first branch clock signal line 112 through the transfer structure 210.

The second branch clock signal line 114 electrically connects the second clock signal line 314 to the gate driver circuit GOA. For instance, the second clock signal line 314 is electrically connected to the corresponding transfer structure 210 through the corresponding second opening O2 and then electrically connected to the second branch clock signal line 114 through the transfer structure 210.

The first branch clock signal lines 112 and the second branch clock signal lines 114 intersect the data lines 340. The shielding structures 220 are located between the data lines 340 and the first branch clock signal lines 112 and between the data lines 340 and the second branch clock signal lines 114. The block structures 222 of the shielding structures 220 completely shield an overlapping region between the data lines 340 and the first branch clock signal lines 112 and an overlapping region between the data lines 340 and the second branch clock signal lines 114.

The shielding structures 220 are electrically connected to the first direct current voltage signal line 320. For instance, the first direct current voltage signal line 320 is electrically connected to the shielding structures 220 through the corresponding second openings O2. In some embodiments, the first direct current voltage signal line 320 is electrically connected to the gate driver circuits GOA through the shielding structures 220.

The second direct current voltage signal line 330 is electrically connected to the transmission lines 230. For instance, the second direct current voltage signal line 330 is electrically connected to the transmission lines 230 through the corresponding second openings O2. The second direct current voltage signal line 330 is electrically connected to the gate driver circuits GOA through the transmission lines 230.

In some embodiments, the first direct current voltage signal line 320 and the second direct current voltage signal line 330 are configured to provide direct current voltage signals to the gate driver circuits GOA. For instance, one of the first direct current voltage signal line 320 and the second direct current voltage signal line 330 is configured to provide a system high voltage signal (referred to as a VGH signal in some devices), while the other is configured to provide a system low voltage signal (referred to as a VGL signal in some devices).

The data lines 340 are electrically connected to the sub-pixels SP. For instance, the data lines 340 are electrically connected to sources/drains of the switch devices in the sub-pixels SP and provide data line signals to the sources/drains of the switch devices.

The gate driver circuits GOA are electrically connected to the scan lines 240 through the output signal line 350. For instance, the output signal line 350 is electrically connected to the corresponding scan lines 240 through the corresponding second openings O2, thereby transmitting the scan line signals output by the gate driver circuits GOA to the sub-pixels SP. In other embodiments, the gate driver circuits GOA are further configured to provide the sub-pixels SP with the compensation control signals and the light emitting control signals. In other words, the pixel array substrate 1 may further include a compensation control signal line (not shown) and a light emitting control signal line (not shown) both electrically connected to the gate driver circuits GOA and the sub-pixels SP.

In light of the foregoing, providing the direct current voltage signals to the shielding structures 220 through the first direct current voltage signal line 320 reduces the stray capacitance between the first branch clock signal lines 112 and the data lines 340 and the stray capacitance between the second branch clock signal lines 114 and the data lines 340 and further mitigates the issue of mutual interference between the clock signals and the data line signals.

Figure 3:
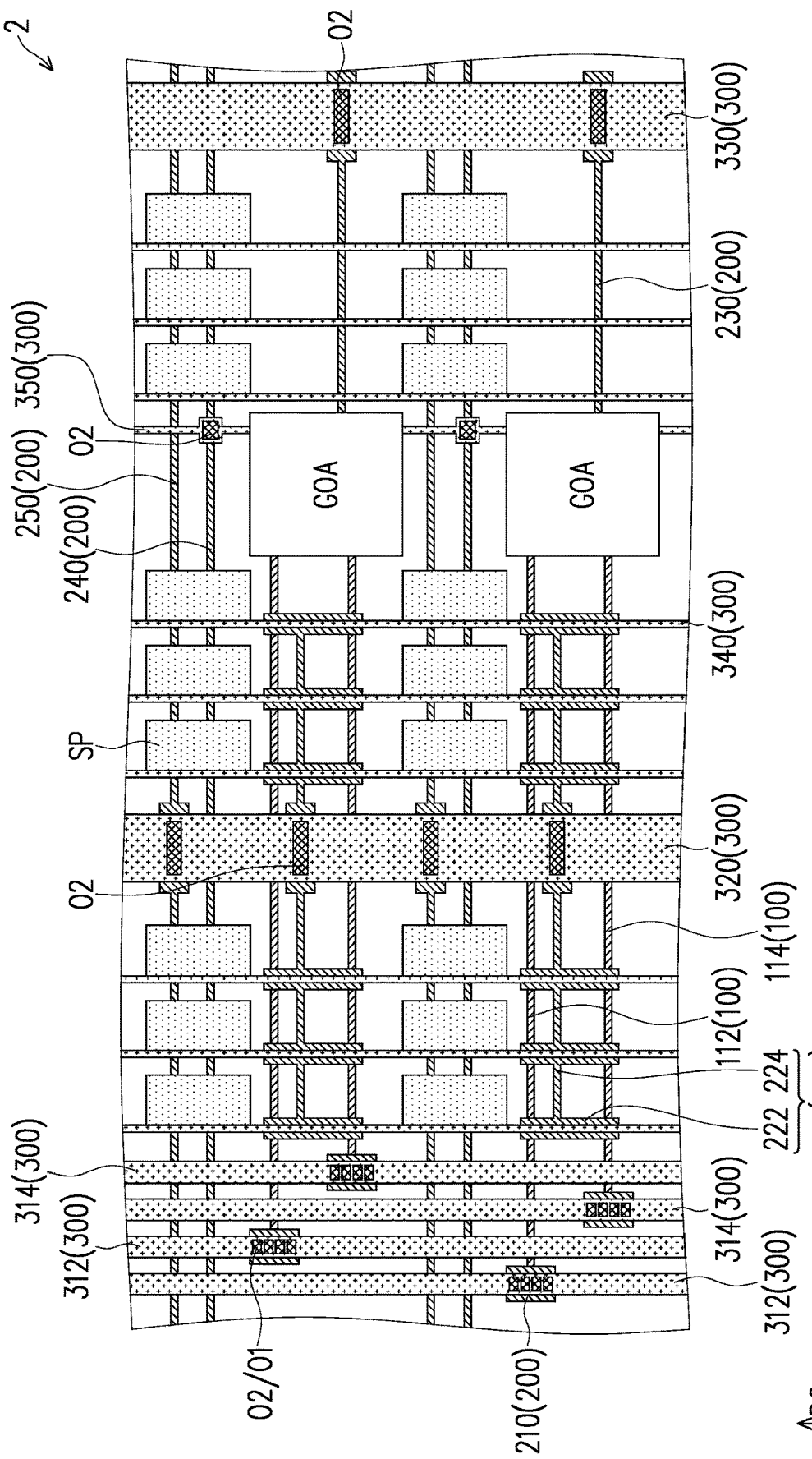
FIG. 3 is a schematic top view of a pixel array substrate according to an embodiment of the disclosure.

FIG. 3 is a schematic top view of a pixel array substrate 2 according to an embodiment of the disclosure. It should be noted that reference numbers of the devices and a part of contents of the previous embodiment depicted in FIG. 2A and FIG. 2B are also used in the embodiment depicted in FIG. 3, where the same reference numbers denote the same or like devices, and descriptions of the same technical contents are omitted. The previous embodiment may be referred for descriptions of the omitted parts, and detailed descriptions thereof are not repeated in the following embodiment.

The main difference between the pixel array substrate 2 depicted in FIG. 3 and the pixel array substrate 1 depicted in FIG. 2A lies in that the first direct current voltage signal line 320 of the pixel array substrate 2 is electrically connected to the common signal lines 250 and the shielding structures 220. In this embodiment, the shielding structures 220 are not connected to the gate driver circuits GOA. In this embodiment, the first direct current voltage signal line 320 is configured to provide the direct current voltage signals (which may refer to VDD signals, VSS signals, or reference voltage signals in some devices) to the sub-pixels SP.

In light of the foregoing, providing the direct current voltage signals to the shielding structures 220 through the first direct current voltage signal line 320 reduces the stray capacitance between the first branch clock signal lines 112 and the data lines 340 and the stray capacitance between the second branch clock signal lines 114 and the data lines 340 and further mitigates the issue of mutual interference between the clock signals and the data line signals.

Figure 4:
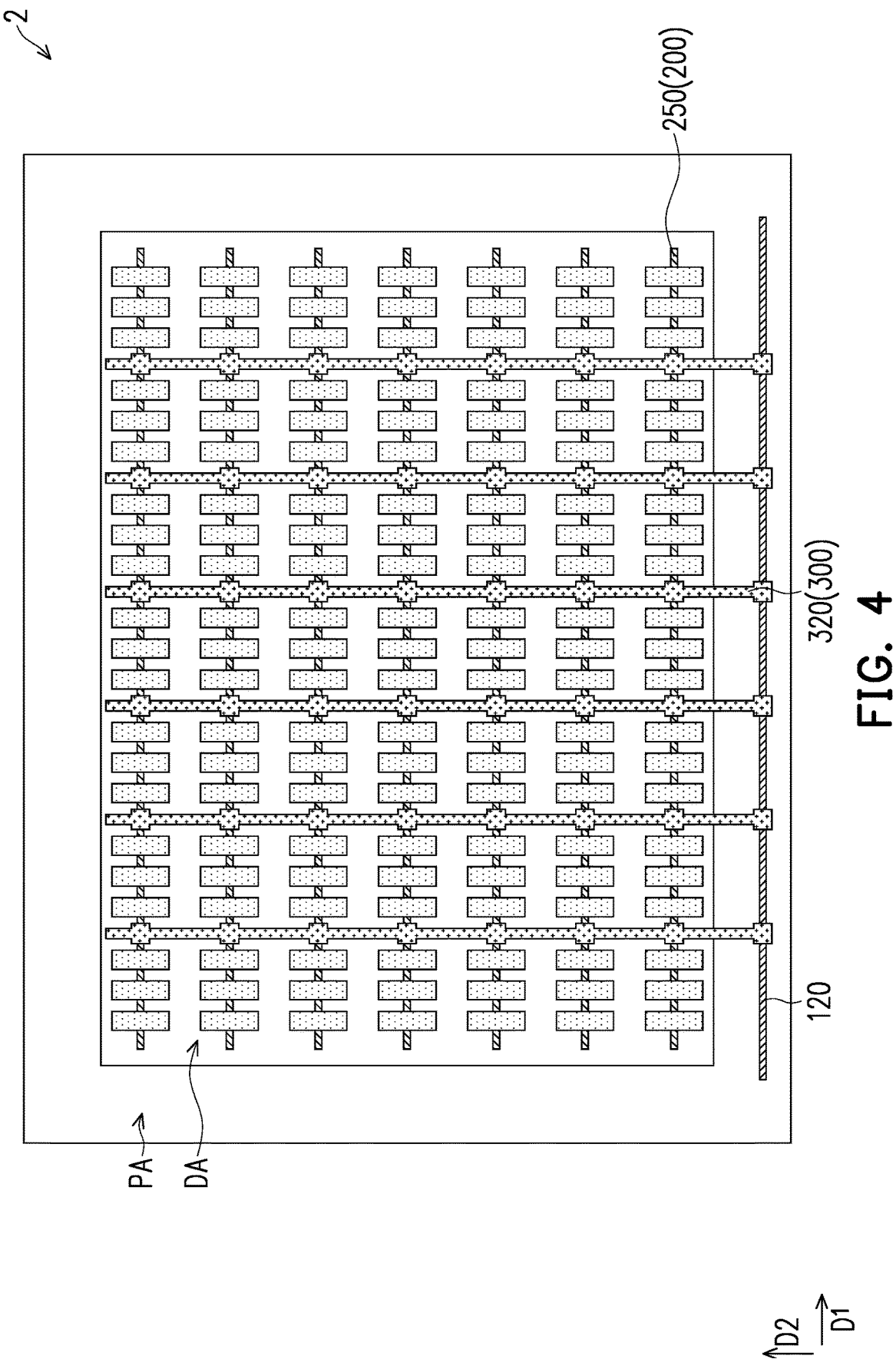
FIG. 4 is a schematic top view of a pixel array substrate according to an embodiment of the disclosure.

FIG. 4 is a schematic top view of the pixel array substrate 2 according to an embodiment of the disclosure. It should be noted that reference numbers of the devices and a part of contents of the previous embodiment depicted in FIG. 3 are also used in the embodiment depicted in FIG. 4, where the same reference numbers denote the same or like devices, and descriptions of the same technical contents are omitted. The previous embodiment may be referred for descriptions of the omitted parts, and detailed descriptions thereof are not repeated in the following embodiment.

With reference to FIG. 4, in this embodiment, the peripheral area PA of the pixel array substrate 2 includes a signal connection line 120. The signal connection line 120 may be a portion of the first conductive patterns 100 (with reference to FIG. 3) or a portion of the second conductive patterns 200 (with reference to FIG. 3). The signal connection line 120 extends along the first direction D1 and connects a plurality of first direct current voltage signal lines 320, thereby enhancing the uniformity of the distribution of the direct current voltage signals on different first direct current voltage signal lines 320. In this embodiment, the first direct current voltage signal lines 320 are electrically connected to the signal connection line 120 and the common signal lines. The common signal lines are disposed in the display area DA, while the signal connection line 120 is disposed in the peripheral area PA.

Figure 5:
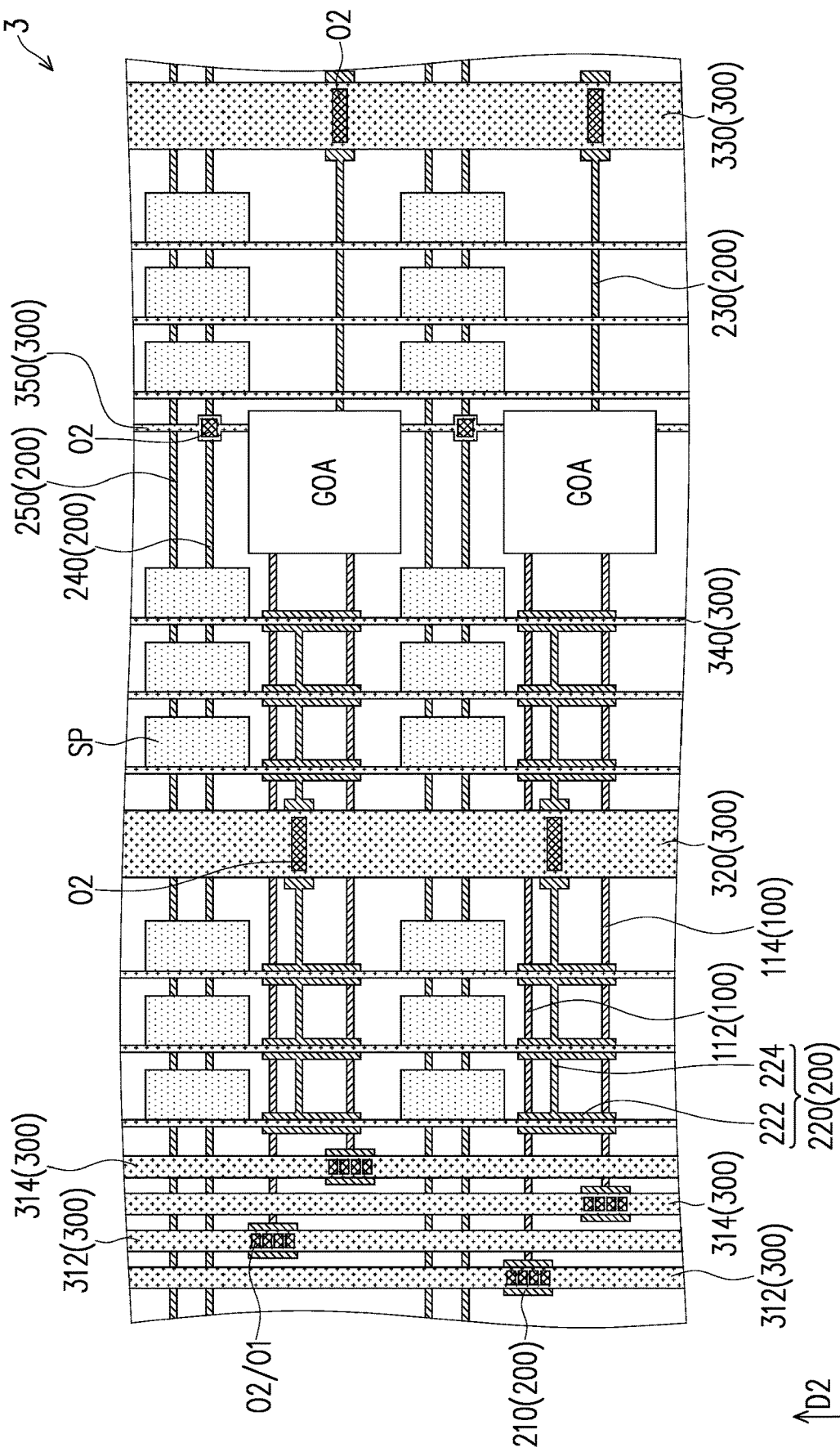
FIG. 5 is a schematic top view of a pixel array substrate according to an embodiment of the disclosure.

FIG. 5 is a schematic top view of a pixel array substrate 3 according to an embodiment of the disclosure. It should be noted that reference numbers of the devices and a part of contents of the previous embodiment depicted in FIG. 2A and FIG. 2B are also used in the embodiment depicted in FIG. 5, where the same reference numbers denote the same or like devices, and descriptions of the same technical contents are omitted. The previous embodiment may be referred for descriptions of the omitted parts, and detailed descriptions thereof are not repeated in the following embodiment.

The main difference between the pixel array substrate 3 depicted in FIG. 5 and the pixel array substrate 1 depicted in FIG. 2A lies in that the first direct current voltage signal line 320 of the pixel array substrate 3 is not directly connected to the sub-pixels SP and the gate driver circuits GOA. In this embodiment, the direct current voltage provided to the first direct current voltage signal line 320 may be different from the direct current voltage provided to the sub-pixels SP and the gate driver circuits GOA. In other words, the first direct current voltage signal line 320 is electrically independent from the sub-pixels SP and the gate driver circuits GOA.

Figure 6:
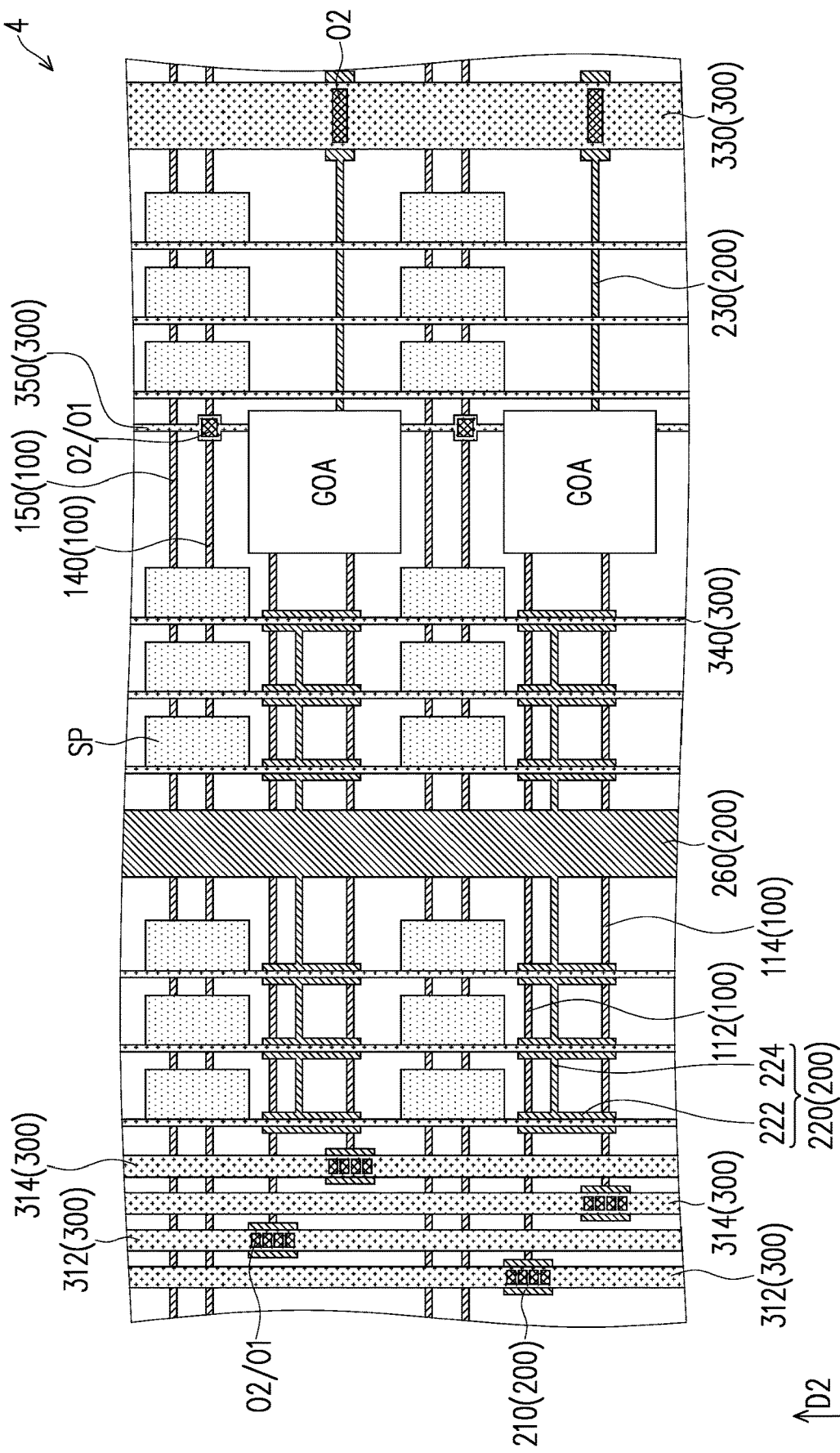
FIG. 6 is a schematic top view of a pixel array substrate according to an embodiment of the disclosure.

FIG. 6 is a schematic top view of a pixel array substrate 4 according to an embodiment of the disclosure. It should be noted that reference numbers of the devices and a part of contents of the previous embodiment depicted in FIG. 5 are also used in the embodiment depicted in FIG. 6, where the same reference numbers denote the same or like devices, and descriptions of the same technical contents are omitted. The previous embodiment may be referred for descriptions of the omitted parts, and detailed descriptions thereof are not repeated in the following embodiment.

The main difference between the pixel array substrate 4 depicted in FIG. 6 and the pixel array substrate 3 depicted in FIG. 5 lies in that the third conductive patterns 300 in the pixel array substrate 3 depicted in FIG. 5, include the first direct current voltage signal line 320; however, in the pixel array substrate 4 depicted in FIG. 6, the second conductive patterns 200 include the first direct current voltage signal line 260.

With reference to FIG. 6, the first direct current voltage signal line 260 and the shielding structures 220 belong to the same conductive layer and are integrally formed. Providing the direct current voltage signals to the shielding structures 220 through the first direct current voltage signal line 320 reduces the stray capacitance between the first branch clock signal lines 112 and the data lines 340 and the stray capacitance between the second branch clock signal lines 114 and the data lines 340 and further mitigates the issue of mutual interference between the clock signals and the data line signals.

Besides, in this embodiment, the first conductive patterns 100 include the scan lines 140 and the common signal lines 150. The scan lines 140 and the common signal lines 150 extend along the first direction D1. The scan lines 140 and the common signal lines 150 are electrically connected to the sub-pixels SP. The output signal line 350 is electrically connected to the scan lines 140.

Figure 7A:
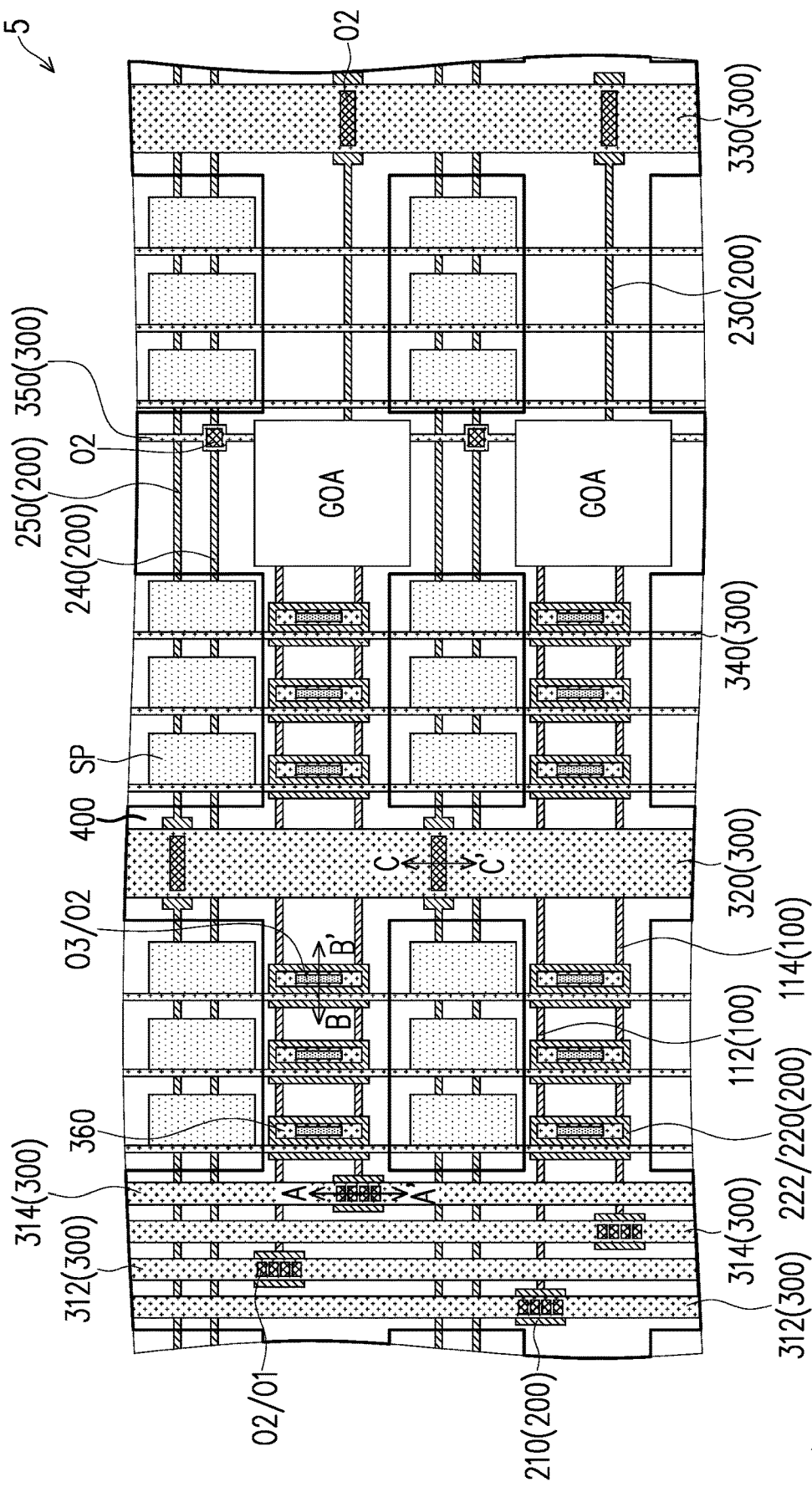
FIG. 7A is a schematic top view of a pixel array substrate according to an embodiment of the disclosure.
Figure 7B:
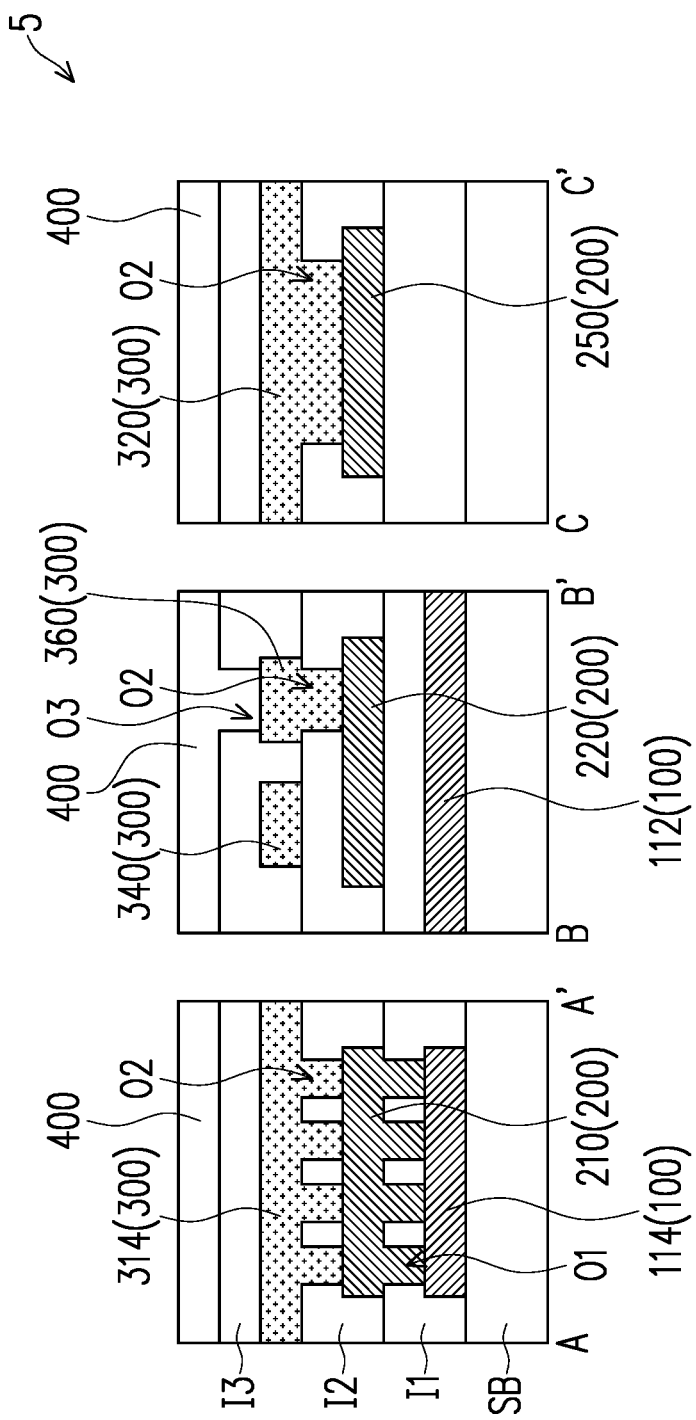
FIG. 7B is a schematic cross-sectional view taken along the sectional line A-A', the sectional line B-B', and the sectional line C-C' depicted in FIG. 7A.

FIG. 7A is a schematic top view of a pixel array substrate 5 according to an embodiment of the disclosure. FIG. 7B is a schematic cross-sectional view taken along the sectional line A-A', the sectional line B-B', and the sectional line C-C' depicted in FIG. 7A. It should be noted that reference numbers of the devices and a part of contents of the previous embodiment depicted in FIG. 5 are also used in the embodiment depicted in FIG. 7A and FIG. 7B, where the same reference numbers denote the same or like devices, and descriptions of the same technical contents are omitted. The previous embodiment may be referred for descriptions of the omitted parts, and detailed descriptions thereof are not repeated in the following embodiment.

The main difference between the pixel array substrate 5 depicted in FIG. 7A and the pixel array substrate 3 depicted in FIG. 5 lies in that the direct current voltage signals is provided to the shielding structures 220 through fourth conductive patterns 400, which reduces the stray capacitance between the first branch clock signal lines 112 and the data lines 340 and the stray capacitance between the second branch clock signal lines 114 and the data lines 340 and further mitigates the issue of mutual interference between the clock signals and the data line signals.

With reference to FIG. 7A and FIG. 7B, the fourth conductive patterns 400 are located on the third dielectric layers I3 and electrically connected to the shielding structures 220. For instance, the fourth conductive patterns 400 are electrically connected to the transfer structures 360 of the third conductive patterns 300 through the third openings O3 of the third dielectric layers I3. The transfer structures 360 are electrically connected to the shielding structures 220 through the second openings O2 of the second dielectric layers I2.

The shielding structures 220 include a plurality of separated block structures 222. In this embodiment, the block structures 222 are not interconnected through the second conductive patterns 200. The block structures 222 are respectively overlapped with the data lines 340. In this embodiment, one block structure 222 is overlapped with one data line 340 and one transfer structure 360.

In this embodiment, the fourth conductive patterns 400 are not directly connected to the sub-pixels SP and the gate driver circuits GOA. In this embodiment, the direct current voltage provided to the fourth conductive patterns 400 may be different from the direct current voltage provided to the sub-pixels SP and the gate driver circuits GOA. In other words, the fourth conductive patterns 400 are electrically independent from the sub-pixels SP and the gate driver circuits GOA.

Figure 8:
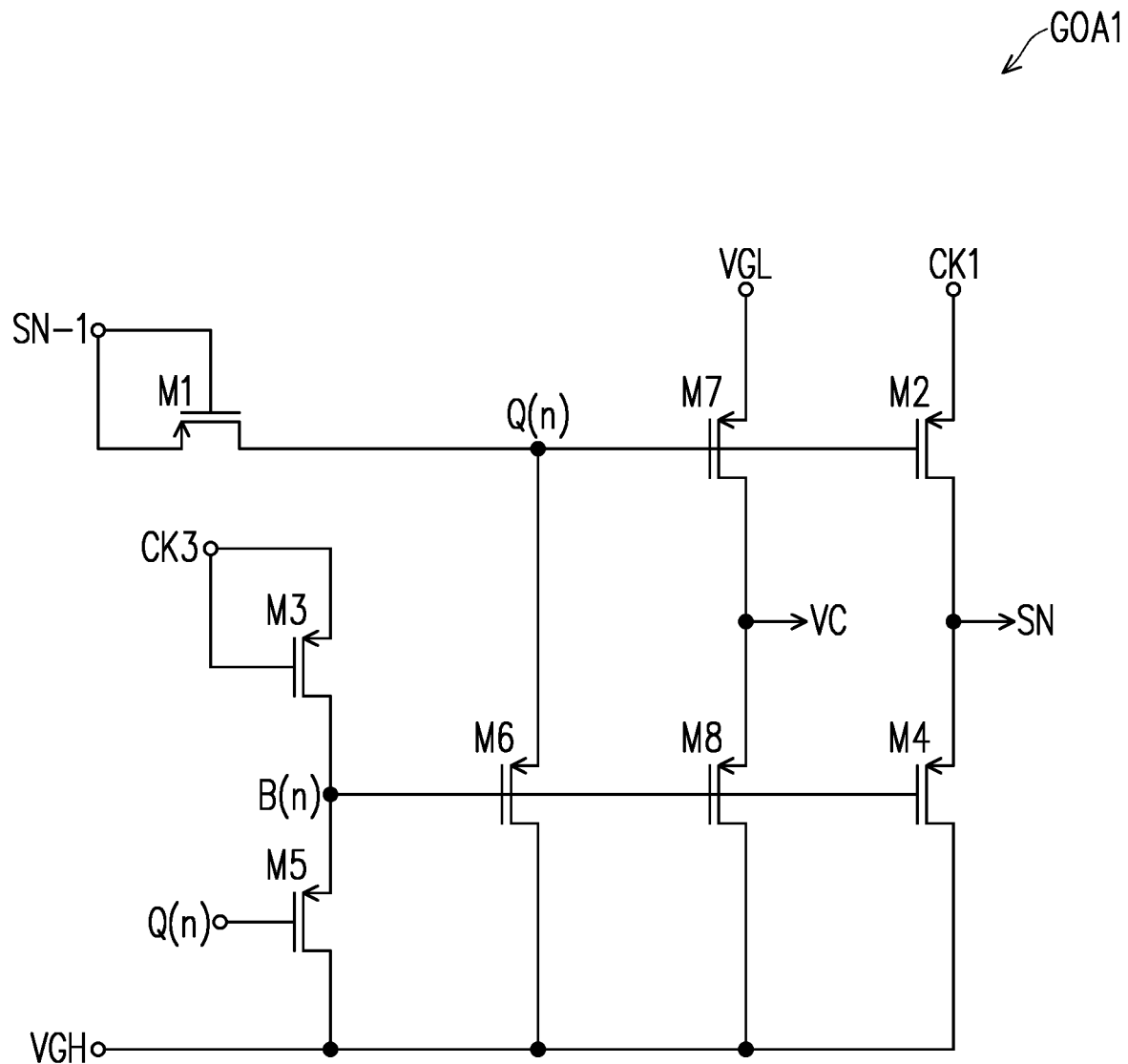
FIG. 8 is a circuit diagram of a gate driver circuit of a pixel array substrate according to an embodiment of the disclosure.

FIG. 8 is a circuit diagram of a gate driver circuit GOA1 of a pixel array substrate according to an embodiment of the disclosure. With reference to FIG. 8, the gate driver circuit GOA1 includes a first thin film transistor M1 to an eighth thin film transistor M8.

A gate and a first terminal of the first thin film transistor M1 is electrically connected to a scan line signal SN-1 output by a previous stage gate driver circuit. A second terminal of the first thin film transistor M1 is electrically connected to a node Q(n).

A gate of the second thin film transistor M2 is electrically connected to the node Q(n). A first terminal of the second thin film transistor M2 is electrically connected to a clock signal CK1. The clock signal CK1 is, for instance, transmitted to the second thin film transistor M2 by the first branch clock signal line 112 (with reference to FIG. 2A, FIG. 3, FIG. 5, FIG. 6, and FIG. 7A). A second terminal of the second thin film transistor M2 is electrically connected to a scan line signal SN. For instance, the second terminal of the second thin film transistor M2 is electrically connected to the output signal line 350 (with reference to FIG. 2A, FIG. 3, FIG. 5, FIG. 6, and FIG. 7A), and the scan line signal SN is output to the scan lines and the next stage gate driver circuit through the output signal line 350.

A gate and a first terminal of the third thin film transistor M3 are electrically connected to a clock signal CK3. The clock signal CK3 is, for instance, transmitted to the third thin film transistor M3 by the second branch clock signal line 114 (with reference to FIG. 2A, FIG. 3, FIG. 5, FIG. 6, and FIG. 7A). A second terminal of the third thin film transistor M3 is electrically connected to a node B(n).

A gate of a fourth thin film transistor M4 is electrically connected to the node B(n). A first terminal of the fourth thin film transistor M4 is electrically connected to the scan line signal SN. A second terminal of the fourth thin film transistor M4 is electrically connected to a system high voltage signal VGH.

A gate of the fifth thin film transistor M5 is electrically connected to the node Q(n). A first terminal of the fifth thin film transistor M5 is electrically connected to the node B(n). A second terminal of the fifth thin film transistor M5 is electrically connected to the system high voltage signal VGH.

A gate of the sixth thin film transistor M6 is electrically connected to the node B(n). A first terminal of the sixth thin film transistor M6 is electrically connected to the node Q(n). A second terminal of the sixth thin film transistor M6 is electrically connected to the system high voltage signal VGH.

A gate of the seventh thin film transistor M7 is electrically connected to the node Q(n). A first terminal of the seventh thin film transistor M7 is electrically connected to a system low voltage signal VGL. A second terminal of the seventh thin film transistor M7 is electrically connected to a compensation control signal VC. In some embodiments, the compensation control signal VC output by the gate driver circuit GOA1 is transmitted to the sub-pixels through the compensation control signal line.

A gate of the eighth thin film transistor M8 is electrically connected to the node B(n). A first terminal of the eighth thin film transistor M8 is electrically connected to the compensation control signal VC. A second terminal of the eighth thin film transistor M8 is electrically connected to the system high voltage signal VGH.

In some embodiments, if the embodiment depicted in FIG. 2A is taken as an example, the first direct current voltage signal line 320 is configured to transmit one of the system high voltage signal VGH and the system low voltage signal VGL and is electrically connected to the shielding structures 220. The second direct current voltage signal line 330 is configured to transmit the other one of the system high voltage signal VGH and the system low voltage signal VGL.

Figure 9:
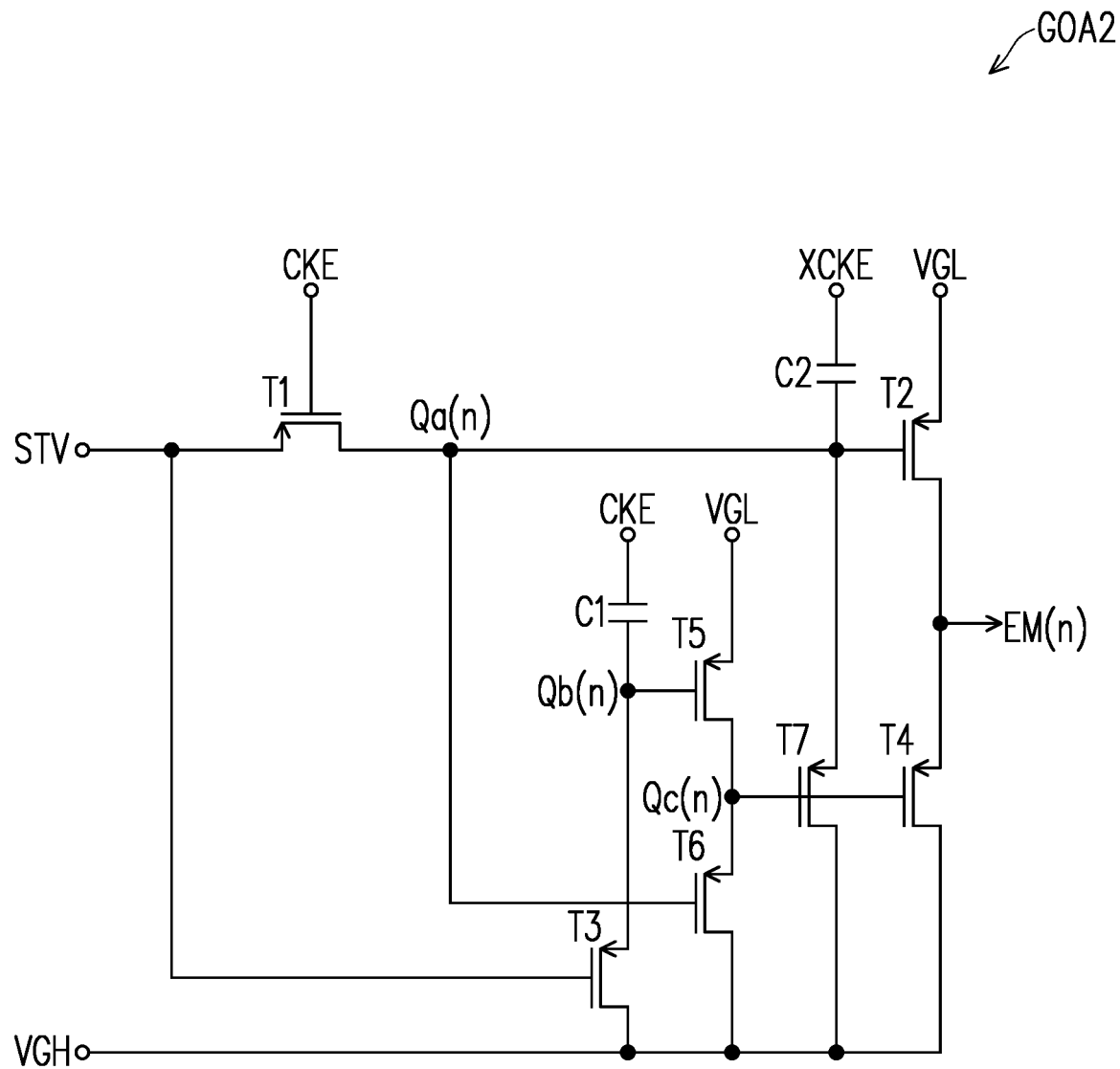
FIG. 9 is a circuit diagram of a gate driver circuit of a pixel array substrate according to an embodiment of the disclosure.

FIG. 9 is a circuit diagram of a gate driver circuit GOA2 of a pixel array substrate according to an embodiment of the disclosure. In some embodiments, the pixel array substrate includes both the gate driver circuit GOA1 depicted in FIG. 8 and the gate driver circuit GOA2 depicted in FIG. 9. With reference to FIG. 9, the gate driver circuit GOA2 includes a first thin film transistor T1 to a seventh thin film transistor T7, a first capacitor C1, and a second capacitor C2.

A gate of the first thin film transistor T1 is electrically connected to a clock signal CKE. A first terminal of the first thin film transistor T1 is electrically connected to a start signal STV. A second terminal of the first thin film transistor T1 is electrically connected to a node Qa(n).

A gate of the second thin film transistor T2 is electrically connected to the node Qa(n). A first terminal of the second thin film transistor T2 is electrically connected to a system low voltage signal VGL. A second terminal of the second thin film transistor T2 is electrically connected to a light emitting control signal EM(n). In some embodiments, the light emitting control signal EM(n) output by the gate driver circuit GOA2 is transmitted to the sub-pixels through a light emitting control signal line.

A gate of the third thin film transistor T3 is electrically connected to the start signal STV. A first terminal of the third thin film transistor T3 is electrically connected to a node Qb(n). A second terminal of the third thin film transistor T3 is electrically connected to a system high voltage signal VGH.

A gate of the fourth thin film transistor T4 is electrically connected to a node Qc(n). A first terminal of the fourth thin film transistor T4 is electrically connected to the light emitting control signal EM(n). A second terminal of the fourth thin film transistor T4 is electrically connected to the system high voltage signal VGH.

A gate of the fifth thin film transistor T5 is electrically connected to the node Qb(n). A first terminal of the fifth thin film transistor T5 is electrically connected to the system low voltage signal VGL. A second terminal of the fifth thin film transistor T5 is electrically connected to the node Qc(n).

A gate of the sixth thin film transistor T6 is electrically connected to the node Qa(n). A first terminal of the sixth thin film transistor T6 is electrically connected to the node Qc(n). A second terminal of the sixth thin film transistor T6 is electrically connected to the system high voltage signal VGH.

A first terminal of the seventh thin film transistor T7 is electrically connected to the node Qa(n). A second terminal of the seventh thin film transistor T7 is electrically connected to the system high voltage signal VGH.

A first terminal of the first capacitor C1 is electrically connected to the clock signal CKE. A second terminal of the first capacitor C1 is electrically connected to the node Qb(n).

A first terminal of the second capacitor C2 is electrically connected to a clock signal XCKE. A second terminal of the second capacitor C2 is electrically connected to the node Qa(n).

In some embodiments, if the embodiment depicted in FIG. 2A is taken as an example, the first direct current voltage signal line 320 is configured to transmit one of the system high voltage signal VGH and the system low voltage signal VGL and is electrically connected to the shielding structures 220. The second direct current voltage signal line 330 is configured to transmit the other one of the system high voltage signal VGH and the system low voltage signal VGL.

To sum up, according to one or more embodiments of the disclosure, providing the direct current voltage signals to the shielding structures reduces the stray capacitance between the branch clock signal lines and the data lines and further mitigates the issue of mutual interference between the clock signals and the data line signals.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A pixel array substrate, comprising:
    a substrate;
    a gate driver circuit, disposed above the substrate;
    a first conductive pattern, located above the substrate and comprising a first branch clock signal line, wherein the first branch clock signal line is electrically connected to the gate driver circuit;
    a first dielectric layer, wherein the first conductive pattern is located between the substrate and the first dielectric layer;
    a second conductive pattern, located on the first dielectric layer and comprising a shielding structure overlapped with the first branch clock signal line;
    a second dielectric layer, located on the first dielectric layer, wherein the second conductive pattern is located between the first dielectric layer and the second dielectric layer; and
    a third conductive pattern, located on the second dielectric layer and comprising a first clock signal line and a data line, wherein the first branch clock signal line electrically connects the first clock signal line to the gate driver circuit and intersects the data line, and the shielding structure is located between the data line and the first branch clock signal line.

2. The pixel array substrate according to claim 1, wherein the first conductive pattern further comprises:
    a second branch clock signal line, electrically connected to the gate driver circuit, wherein the shielding structure completely covers an overlapping region between the data line and the first branch clock signal line and an overlapping region between the data line and the second branch clock signal line.

3. The pixel array substrate according to claim 1, wherein the second conductive pattern or the third conductive pattern comprises a direct current voltage signal line, and the shielding structure is electrically connected to the direct current voltage signal line.

4. The pixel array substrate according to claim 3, wherein the first conductive pattern or the second conductive pattern further comprises a common signal line, wherein the common signal line extends along a first direction, the direct current voltage signal line extends along a second direction that is not parallel to the first direction, and the direct current voltage signal line is electrically connected to the common signal line.

5. The pixel array substrate according to claim 4, wherein the first conductive pattern or the second conductive pattern further comprises a signal connection line, wherein the signal connection line extends along the first direction, the direct current voltage signal line is electrically connected to the signal connection line, the common signal line is located in a display area of the pixel array substrate, and the signal connection line is located in a peripheral area of the pixel array substrate.

6. The pixel array substrate according to claim 4, wherein the first conductive pattern or the second conductive pattern further comprises a scan line electrically connected to the gate driver circuit, and the pixel array substrate further comprises:
    a sub-pixel, electrically connected to the scan line, the data line, and the common signal line.

7. The pixel array substrate according to claim 3, wherein the direct current voltage signal line is electrically connected to the gate driver circuit.

8. The pixel array substrate according to claim 3, wherein the first conductive pattern or the second conductive pattern comprises a scan line electrically connected to the gate driver circuit, and the pixel array substrate further comprises:
    a sub-pixel, electrically connected to the scan line and the data line, wherein the direct current voltage signal line is electrically independent from the sub-pixel and the gate driver circuit.

9. The pixel array substrate according to claim 1, wherein the third conductive pattern comprises a plurality of the data lines, and the shielding structure comprises:

a plurality of block structures, respectively overlapped with the data lines; and at least one connection line, connected to the block structures, wherein a width of the block structures in an extension direction of the data lines is greater than a width of the at least one connection line in the extension direction of the data lines.

10. The pixel array substrate according to claim 1, further comprising:

a third dielectric layer, located on the second dielectric layer, wherein the third conductive pattern is located between the second dielectric layer and the third dielectric layer; and a fourth conductive pattern, located on the third dielectric layer and electrically connected to the shielding structure, wherein the third conductive pattern comprises a plurality of the data lines, the shielding structure comprises a plurality of separated block structures, and the block structures are respectively overlapped with the data lines.

* * * * *